US009069916B2

(12) United States Patent
Sarma et al.

(10) Patent No.: US 9,069,916 B2
(45) Date of Patent: Jun. 30, 2015

(54) MODEL SELECTION FROM A LARGE ENSEMBLE OF MODELS

(71) Applicants: Pallav Sarma, San Ramon, CA (US); Wen Hsiung Chen, Danville, CA (US)

(72) Inventors: Pallav Sarma, San Ramon, CA (US); Wen Hsiung Chen, Danville, CA (US)

(73) Assignee: CHEVRON U.S.A. INC., San Ramon, CA (US)

( * ) Notice: Subject to any disclaimer, the term of this patent is extended or adjusted under 35 U.S.C. 154(b) by 358 days.

(21) Appl. No.: 13/840,855

(22) Filed: Mar. 15, 2013

(65) Prior Publication Data

US 2014/0136165 A1 May 15, 2014

Related U.S. Application Data

(60) Provisional application No. 61/725,994, filed on Nov. 13, 2012.

(51) Int. Cl.
| | |
|---|---|
| G06F 17/10 | (2006.01) |
| G06G 7/50 | (2006.01) |
| G06G 7/48 | (2006.01) |
| G06F 17/50 | (2006.01) |
| G06N 7/00 | (2006.01) |
| G06Q 10/06 | (2012.01) |

(52) U.S. Cl.
CPC ............ G06F 17/5009 (2013.01); G06N 7/005 (2013.01); G06Q 10/063 (2013.01); G06Q 10/067 (2013.01)

(58) Field of Classification Search
CPC ............. G06F 17/5009; G06Q 10/063; G06Q 10/067; E21B 41/0092
USPC ..................................................... 703/2, 9, 10
See application file for complete search history.

(56) References Cited

U.S. PATENT DOCUMENTS

| | | | | |
|---|---|---|---|---|
| 8,942,967 | B2 * | 1/2015 | Heidari et al. ................... | 703/10 |
| 2008/0077371 | A1 * | 3/2008 | Yeten et al. ...................... | 703/10 |
| 2008/0243447 | A1 * | 10/2008 | Roggero et al. .................. | 703/1 |

OTHER PUBLICATIONS

Aanonsen, Sigurd I., et al.; "The Ensemble Kalman Filter in Reservoir Engineering—A Review"; Sep. 2009, SPE Journal, pp. 393-412.
Aloise, Daniel, et al.; "NP-Hardness of Euclidean Sum-of-Squares Clustering"; 2009, Machine Learning, vol. 75, pp. 245-248.
Dueck, Gunter, et al.; "Threshold Accepting: A General Purpose Optimization Algorithm Appearing Superior to Simulated Annealing"; 1990, Journal of Computational Physics, vol. 90, pp. 161-175.
Faidi, S.A., et al.; "Experimental Design in Interactive Reservoir Simulation"; 1996, SPE 36005, 1996, pp. 189-194.
Kirkpatrick, S., et al.; "Optimization by Simulated Annealing"; May 1983, Science, vol. 220, No. 4598, pp. 671-680.

(Continued)

*Primary Examiner* — Kamini S Shah
*Assistant Examiner* — Andre Pierre Louis

(57) ABSTRACT

A method, system and processor readable medium containing computer readable software instructions for selecting representative models from a large ensemble of models is disclosed. An ensemble of reservoir models that define an input uncertainty space is provided. A target number of representative models and one or more target percentiles of output variables that the representative models are to approximate are input. The representative models from the ensemble of reservoir models that match the one or more target percentiles of output variables are selected while maximizing the spread between the selected representative models in the input uncertainty space.

18 Claims, 18 Drawing Sheets

(56) References Cited

OTHER PUBLICATIONS

Lee, Herbert K.H., et al.; "Selection of a Representative Sample"; Jun. 2008, Technical Report, University of California, Santa Cruz, pp. 1-15.

MacQueen, J.; "Some Methods for Classification and Analysis of Multivariate Observations"; Univ. of Calif. Press, 1967, Proceedings of the Fifth Berkeley Symposium on Mathematical Statistics and Probability, vol. 1, pp. 281-297.

Naevdal, G., et al.; "Reservoir Monitoring and Continuous Model Updating Using Ensemble Kalman Filter"; 2003, SPE 84372, pp. 1-12.

Russell, S., et al.; "Artificial Intelligence: A Modern Approach ($2^{nd}$ Ed.)"; 2003, Prentice Hall Series, title pages, and pp. 163-171.

Scheidt, C., et al.; "Uncertainty Quantification in Reservoir Performance Using Distances and Kernel Methods: Application to a West Africa Deepwater Turbidite Reservoir"; Dec. 2009, SPE Journal, pp. 680-692.

van Elk, Jan F., et al.; "Improved Uncertainty Management in Field Development Studies Through the Application of the Experimental Design Method to the Multiple Realisations Approach"; Oct. 2000, SPE 64462, pp. 1-10.

Venkataraman, R.; "Application of the Method of Experimental Design to Quantify Uncertainty in Production Profiles"; Apr. 2000, SPE 59422, pp. 1-8.

Wen, X.-H., et al.; "Real-Time Reservoir Model Updating Using Ensemble Kalman Filter"; 2005, SPE 92991, pp. 1-14.

Bickel, J. Eric, et al.; "Discretion, Simulation, and Swanson's (Inaccurate) Mean"; SPE Economics & Management, XP055115036A, Jul. 2011, pp. 128-140.

Biedermann, Stefanie, et al.; "Some Robust Design Strategies for Percentile Estimation in Binary Response Models"; The Canadian Journal of Statistics, vol. 34, No. 4, Dec. 2006, pp. 603-622.

Kiczko, Adam; "Multi-Criteria Decision Support System for Siemianowka Reservoir Under Uncertainties"; XP055115037, International Institute for Applied Systems (IIASA) Interim Report, No. IR-08-026, Sep. 2008, pp. i-viii and pp. 1-18.

Sarma, Pallav, et al.; "Selecting Representative Models from a Large Set of Models"; 2013, SPE 163671, XP008167129, pp. 1-12 with attached Figure 15.

Scheidt, Celine, et al.; "Bootstrap Confidence Intervals for Reservoir Model Selection Techniques"; 2010, XP019767904, Comput. Geosci., vol. 14, pp. 369-382.

International Search Report, issued on May 20, 2014 during the prosecution of International Application No. PCT/US2013/069808.

Written Opinion of the International Searching Authority, issued on May 20, 2014 during the prosecution of International Application No. PCT/US2013/069808.

* cited by examiner

Poro1

Poro2

Poro3

Perm1

Perm2

Perm3

Sg1

Sg2

Sg3

Poro1

Poro2

Poro3

Perm1

Perm2

Perm3

Sg1

Sg2

Sg3

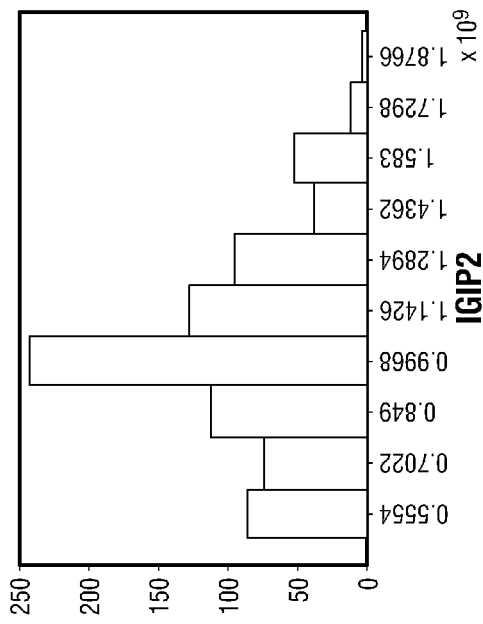
FIG. 2A-1 IGIP1
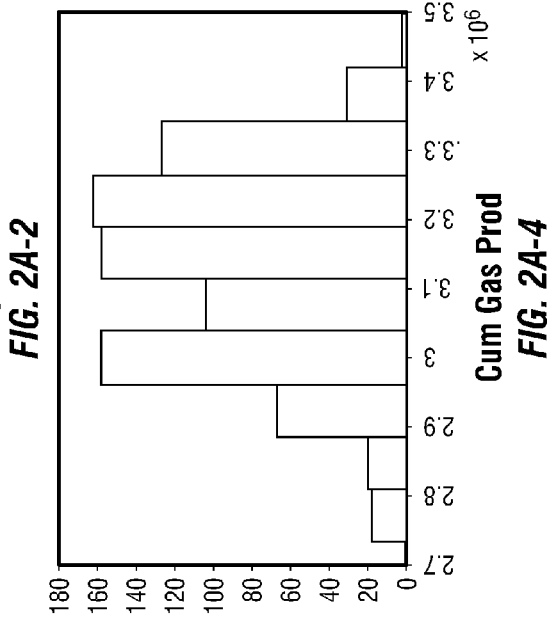
FIG. 2A-2 IGIP2
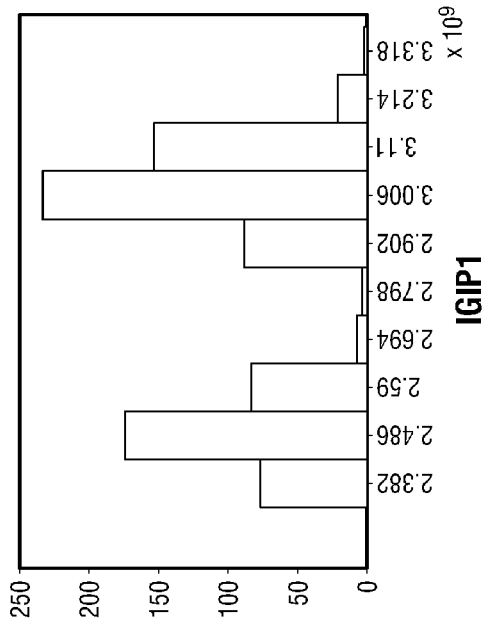
FIG. 2A-3 IGIP
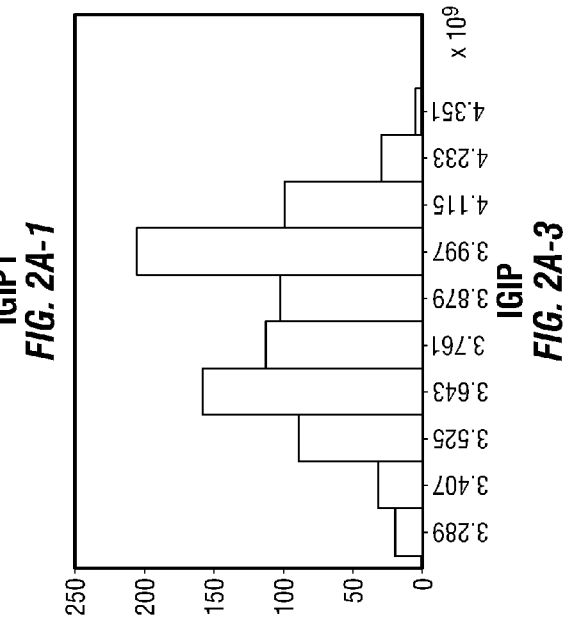
FIG. 2A-4 Cum Gas Prod

IGIP1

IGIP2

IGIP

Cum Gas Prod

IGIP1

IGIP2

IGIP

Cum Gas Prod

IGIP1

IGIP2

IGIP

Cum Gas Prod

IGIP1

IGIP2

IGIP

Cum Gas Prod

Poro1

Poro2

Poro3

Perm1

Perm2

Perm3

Sg1

Sg2

Sg3

Poro1

Poro2

Poro3

Perm1

Perm2

Perm3

Sg1

Sg2

Sg3

IGIP1

IGIP2

IGIP

Cum Gas Prod

IGIP1

IGIP2

IGIP

Cum Gas Prod

Poro1

Poro2

Poro3

Perm1

Perm2

Perm3

Sg1

Sg2

Sg3

|  | MINIMAX APPROACH (SECONDS) | CLUSTERING METHOD (SECONDS) |
|---|---|---|
| SELECTING 3 OUT OF 841 MODELS | 1 | 1493 |
| SELECTING 9 OUT OF 841 MODELS | 365 | MORE THAN A DAY (KILLED) |

US 9,069,916 B2

MODEL SELECTION FROM A LARGE ENSEMBLE OF MODELS

CROSS-REFERENCE TO A RELATED APPLICATION

The present application for patent claims the benefit of U.S. provisional patent application bearing Ser. No. 61/725,994, filed on Nov. 13, 2012, which is incorporated by reference in its entirety.

TECHNICAL FIELD

The present invention generally relates to a method, system and processor readable medium containing computer readable software instructions for selecting representative models from a large ensemble of models, and more particularly to selecting representative models from a large ensemble of models for modeling the behavior of a subsurface reservoir.

BACKGROUND

In order to make the field development decision making and planning process tractable, the decision-makers usually need a few representative models (e.g., P10, P50, P90 models) selected from a large ensemble of reservoir models. This ensemble of models may have been obtained from a static and/or dynamic modeling process involving uncertainty quantification (ED), history matching, optimization, a combination thereof, or other workflows. The usual approach to select a few models is using various variants of clustering. This selection process is not only suboptimal, but it could also be quite difficult to do if multiple output responses and/or percentiles are required and the number of models is large. The current approach in most oil companies is even more naïve, wherein, such models are chosen manually or using Excel spreadsheets. Thus, due to the unavailability of good approaches, representative models are usually chosen based on one or two criteria. Use of such models in the decision making process can lead to suboptimal decisions. As such, there is a need to automatically select a small set of statistically representative models from a larger set based on multiple decision criteria.

BRIEF DESCRIPTION OF THE DRAWINGS

FIGS. 2A-1-2A-4 and 2B-1-2B-4 illustrate histograms and cdfs, respectively, of 4 output variables from 841 models.

FIGS. 3A-1-3A-4 illustrate three models selected using manual model selection.

FIGS. 4A-1-4A-4 illustrate three models selected using minimax model selection.

FIGS. 5A-1-5A-4 illustrate three models selected using k-means clustering.

FIGS. 6A-1-6A-4 illustrate three models selected using minimax greedy model selection.

FIG. 7 illustrates an inverse relationship between two models (IGIP1 and IGIP2).

FIGS. 8A-1-8A-9 illustrate three models selected using manual model selection on cdfs of the input variables.

FIGS. 9A-1-9A-9 illustrate three models selected using minimax model selection on cdfs of the input variables.

FIGS. 10A-1-10A-9 illustrate three models selected using k-means clustering on cdfs of the input variables.

FIGS. 11A-1-11A-4 illustrate nine models selected using minimax model selection.

FIGS. 12A-1-12A-4 illustrate three models selected using distance-based clustering.

FIGS. 13A-1-13A-9 illustrate nine models selected using minimax model selection.

FIGS. 14A-1-14A-9 illustrate three models selected using distance-based clustering.

DETAILED DESCRIPTION

Figures 1, 1A:
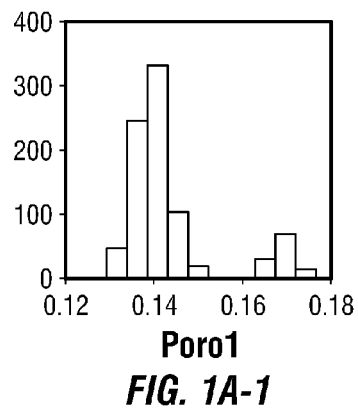
FIGS. 1A-1-1A-9 and 1B-1-1B-9 illustrate histograms and cdfs, respectively, of 9 input variables from 841 models.

Embodiments of the present invention relate to a model selection approach, referred to herein as the minimax approach. As will be described, the minimax model selection approach can simultaneously and efficiently select a few reservoir models from a large ensemble of models by matching target percentiles of multiple output responses. For example, the minimax model selection approach can match P10, P50 and P90 of cumulative oil production (OPC), cumulative water production (WPC), and original oil in place (OOIP), while also obtaining maximally different models in the input uncertainty space. The approach is based on simultaneous solution of two minimax combinatorial optimization problems. Since this requires the solution a complex multi-objective optimization problem, the problem is converted to the solution of a single constrained minimax optimization problem. The solution of this optimization problem is obtained using a global exhaustive search (for small problems), and a very efficient greedy method wherein a simpler optimization problem can be solved directly by enumeration or by Markov chain Monte Carlo methods for larger problems with many models, target percentiles and variables. The minimax model selection approach is implemented in uncertainty quantification software, such as in Chevron's in-house uncertainty quantification software called genOpt and tested with multiple synthetic examples and field cases. The results demonstrate that minimax model selection is much more efficient than clustering and solution quality is generally better than clustering. For some models, minimax model selection approach was orders of magnitude faster than clustering. The minimax model selection approach can be utilized by business units to select P10, P50 and P90 models efficiently for decision making and planning. For example, such reservoir management decisions can include whether to develop new reservoir fields or how to efficiently manage production of current fields.

The term "optimization" (as well as derivatives, other forms of this term, and linguistically related words and phrases), as used herein, is not intended to be limiting in the sense of requiring the present invention to find the best mathematical solution or to make the best decision. Rather, this term can describe working towards a best available or favorable solution, or a solution that offers a specific benefit within a range of constraints. Accordingly, working towards the optimal solution can include searching for a high point, maximum, or minimum of an objective function, continually improving or iteratively refining a solution to convergence, reducing a penalty function, or a combination thereof.

Embodiments of the invention can be implemented in numerous ways, including, for example, as a method (including a computer-implemented method), a system (including a computer processing system), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore, are not to be considered limiting of its scope and breadth.

Reservoir management workflows such as those related to uncertainty quantification, history matching and optimization are slowly but surely moving towards ensemble based approaches, wherein tens to hundreds (or even more if metamodels are used) of models are used to quantify uncertainty in model predictions. Good examples of such workflows are experimental design and the ensemble Kalman filter. However, analysis of such a large number of models in the decision making and planning process is generally intractable, thus, decision-makers may still require a subset of representative models (e.g., P10, P50, P90 models) for the decision making and planning process. As such, an approach is required to obtain a small set of representative models from a large ensemble of models. This problem can be formally written as: given N independent input random variables $x_1, \ldots, x_N$ (e.g., water-oil contact (WOC), permeability multiplier) and M output random variables of interest $y_1, \ldots, y_M$ (such as net present value (NPV), cumulative oil production (OPC), cumulative water production (WPC), cumulative gas production (GPC), initial oil in place (IOIP), initial gas in place (IGIP)), and a large but finite set of K models $\mathbb{C} = \{c_1, \ldots, c_K\}$, the problem is to determine a small subset of P models $\tilde{\mathbb{C}} = \{c_1, \ldots, c_P\} \subset \mathbb{C}$, that are "statistically representative" of $\mathbb{C}$, and P<<K.

Since the decision making problem and decision analysis using these models are usually based on the probability distributions of one or more of the output random variables, "statistically representative" implies that the models selected in $\tilde{\mathbb{C}}$, are somehow representative of the statistical properties of all the output random variables $Y_1, \ldots, Y_M$ obtained from $\mathbb{C}$. While there can be various ways to define statistical representativeness, the embodiments disclosed herein are based on selecting models that are close to certain target percentiles (e.g., P10, P50, P90) of all the output variables $y_1, \ldots, y_M$ obtained from $\mathbb{C}$. The reasoning behind such an approach is that these percentiles are the main inputs to decision analysis algorithms, and models selected in this manner are consistent with their use in the decision making process. At the same time, the models selected in $\tilde{\mathbb{C}}$ should be maximally "different" from each other so that they span the N dimensional input uncertainty space as widely as possible. This is useful for a robust model selection process in the face of changing decision processes and decision variables in the future. All the decision (output) variables $y_1, \ldots, y_M$ should also be used in this process, because using just a few can lead to suboptimal model selection.

The usual approach for model selection, at least in the petroleum industry, is by the application of some variant of clustering, such as distance-based clustering, where k-means clustering is used with distances between models defined based on some of the input and output variables. Clustering based approaches essentially try to find models that are different from each other based on some definition of distance between them, as such, the objective of obtaining "statistical representativeness" as defined here is not directly tackled. Thus, the selected models may not be consistent with the percentiles of the output variables $y_1, \ldots, y_M$ used in decision analysis. Further, because clustering (k-means) is an n-p hard problem, it can also be quite difficult to apply practically if the number of input and output variables and the number of models is large. The current approach in most oil companies can be even more naïve, where the P10, P50 and P90 models used in the decision making process are usually based on just one or two variables like IOIP, and obtained manually or using Excel spreadsheets.

The minimax model selection approach is aimed at directly solving the problem of statistical representativeness. The minimax model selection approach can simultaneously and efficiently select a few reservoir models from a large ensemble of models by matching target percentiles of multiple output responses (e.g., matching P10, P50 and P90 of OPC, WPC and OOIP), while also obtaining maximally different models in the input uncertainty space. The minimax model selection approach is based on the simultaneous solution of two minimax combinatorial optimization problems. Since this involves the solution of a complex multi-objective combinatorial optimization problem, which can easily become intractable for a moderate number of target percentiles and large number of models, the problem is converted to the solution of a single constrained minimax optimization problem. The solution of this optimization problem is obtained using a global exhaustive search (for small problems), and a greedy method based on Markov chain Monte Carlo for larger problems with many target percentiles and variables. The minimax model selection approach is implemented in uncertainty quantification software, such as Chevron's in-house uncertainty quantification software called genOpt. The application of minimax to a field case and comparison to distance-based clustering is provided later herein.

The MiniMax Algorithm for Model Selection

As explained above, model selection based on statistical representativeness while also maximizing spread in the input uncertainty space can be approached directly by simultaneously solving two minimax optimization problems. However, before the optimization problems can be defined, the decision-makers have to decide how many models should be used for the decision analysis problem and what should these models statistically represent. In other words, if P models are needed, the decision-makers have to determine which percentiles of the cdfs of the output variables these models should approximate. For example, if 3 models are needed, the decision-makers have to determine whether they want the 3 models to represent the target percentiles (e.g., P10, P50 and P90 or P25, P50 and P75) of the distributions of $y_1, \ldots, y_M$. Once the goal is defined, the optimizations problems can be written formally as:

$$\min_{x^1,\ldots,x^P \in \mathbb{C}} \sum_{j=1}^{P} \left\{ \max_k \min_l \left| \frac{y_k^j - \bar{y}_k^l}{\bar{y}_k^l} \right| \right\} \; \forall \, k = 1, \ldots, M; l = 1, \ldots, P$$

sub to:

$$\text{unique}([prctile(y_k^1), \ldots, prctile(y_k^P)]) = P \quad \forall \, k = 1, \ldots, M \quad (1)$$

where:

unique(X) = number of unique elements in vector X prctile(x) = index(1, ..., P) of closest target percentile to x $$\min_{x^1,\ldots,x^P \in \mathbb{C}} \left\{ \min_{j,l; j \neq l} \left( \min_i |x_i^j - x_i^l| \right) \right\} \; \forall \, j, l = 1, \ldots, P; i = 1, \ldots, N \quad (2)$$

Here, $X=[x_1, \ldots, x_N]$ is a model from the set $\mathbb{C}$ and $\bar{y}_k^l$ is the target percentile of $y_k$ corresponding to index l. Equation (1) defines the problem of finding P models that are close to P target percentiles of each of the N input variables $x_1, \ldots, x_N$ such that no two models match the same percentile of any of the M output variables $y_1, \ldots, y_M$. This constraint makes this a very difficult combinatorial optimization problem to solve. Equation (2) defines the problem of maximizing spread between the selected models in the input uncertainty space, and this problem can be solved relatively easily. However, both optimization problems have to be solved simultaneously. Therefore, this results in a complex multi-objective combinatorial optimization problem. In order to make this problem tractable, a simpler one-objective combinatorial optimization problem can be solved as:

$$\min_{X^1, \ldots, X^P \in \mathbb{C}} \left\{ \min_{j,l;j \neq l} \left( \min_i |x_i^j - x_i^l| \right) \right\} \quad \forall j, l = 1, \ldots, P; i = 1, \ldots, N \quad (1)$$

sub to:

$$\sum_{j=1}^{P} \left\{ \max_k \min_l \left| \frac{y_k^j - \bar{y}_k^l}{\bar{y}_k^l} \right| \right\} \leq \varepsilon \quad \forall k = 1, \ldots, M; l = 1, \ldots, P \quad (3)$$

$$\text{unique}([prctile(y_k^1), \ldots, prctile(y_k^P)]) = P \quad \forall k = 1, \ldots, M$$

Equation (3) essentially states that, among a set of models that are closer than a predefined tolerance $\varepsilon$ to the P target percentiles, find P models that maximize spread in the input uncertainty space such that no two models match the same percentile of any of the M output variables $y_1, \ldots, y_M$. By defining the optimization problem in this manner, instead of solving two optimization problems simultaneously, they are now solved sequentially, wherein, Equation (1) is solved first to obtain a subset of models $\hat{\mathbb{C}}$ that satisfy the tolerance constraint, followed by solution of Equation (2), where the search space is constrained to $\hat{\mathbb{C}}$. Note that Equations (1) and (2) can also be combined the other way round, wherein, Equation (1) is the objective function and Equation (2) becomes an additional constraint. However, Equation (3) gives more control and importance to the target percentile matching problem, which is usually the more important factor.

For small problems with a few hundred models, a few input and output variables (less than 10) and a few target percentiles (less than 5), Equation (3) can be solved by exhaustive enumeration to obtain the globally best set of models satisfying Equation (3). However for larger problems with thousands of models and many target percentiles, such an approach becomes less feasible due to the combinatorial nature of Equation (1). The most common approach for solution of such combinatorial optimization problems are Markov Chain Monte Carlo (MCMC) approaches such as the well known Simulated Annealing (SA). SA was applied to a few real and synthetic datasets, but did not perform very well compared to a "greedy" algorithm discussed below.

The basic idea behind the greedy algorithm is that instead of solving for P models simultaneously as in Equation (1), the P models are solved for sequentially, while ensuring that the $j^{th}$ model found does not match the same target percentiles as the models found before (j-1 to 1). If Equation (4) is implemented such that after the $j^{th}$ model is found, the target percentiles that the $j^{th}$ model matches are removed from the next optimization, then the non-zero constraint (similar to the uniqueness constraint) is not necessary. Equation (4) implemented in this manner can be solved quite easily even for a large number of models and target percentiles, as it is no longer a combinatorial optimization problem, and scales linearly with the number of models, variables and percentiles. It is however, a greedy local algorithm, and it can easily get trapped in local minimum. Thus, it is useful to evaluate Equation (4) many times (thousands) with an additional randomization step and select the best solutions (subset $\hat{\mathbb{C}}$) for constraining Equation (3). This is still very efficient even for large problems.

$$\text{for } j = 1: P \quad (4)$$
$$X^j = \arg \min_{X^j \in C} \max_k \min_l \left| \frac{y_k^j - \bar{y}_k^l}{\bar{y}_k^l} \right| \quad \begin{array}{l} \forall k = 1, \ldots, \\ M; l = 1, \ldots, \\ P - j + 1 \end{array}$$
$$\text{sub to:}$$
$$\text{nnz}(prctile(Y^j) == prctile(Y^q)) = 0 \quad \forall q = j - 1, \ldots, 1$$
end
where:
nnz(X == Y) = number of non zero elements in vector X == Y
prctile(X) = vector of indices (1, ..., P)
of closest target percentiles to X The modified version of Equation (4) with randomization is below. Here, instead of selecting the best $X^j$ that is closest to a set of target percentiles, a model $X^j$ can randomly be chosen from models that are close to a set of target percentiles within a specified tolerance $\varepsilon$.

$$\text{for } i = 1: \text{nTrials} \quad (5)$$
$$\text{for } j = 1: P$$
$$X^j = \arg \text{rand}_{X^j \in C} \left\{ \left( \max_k \min_l \left| \frac{y_k^j - \bar{y}_k^l}{\bar{y}_k^l} \right| \right) < \varepsilon \right\} \quad \begin{array}{l} \forall k = 1, \ldots, \\ M; l = 1, \ldots, \\ P - j + 1 \end{array}$$
$$\text{sub to:} \quad \forall q = j - 1, \ldots, 1$$
$$\text{nnz}(prctile(Y^j) == prctile(Y^q)) = 0$$
end
end Since subset $\hat{\mathbb{C}}$ is usually not very large (e.g., a few hundred models), Equation (2) constrained to $\hat{\mathbb{C}}$ can be solved very efficiently. While the optimization problem in Equations (4) or (5) can be solved efficiently by enumeration for a reasonably large set of models, MCMC techniques such as SA or other stochastic optimization techniques can be used for very large problems (e.g., $1e^{5+}$ models). This SA problem is much simpler than the SA as applied directly to Equation (1). For the example dataset below, a simple but efficient form of SA called Threshold Annealing was applied where the transition probabilities between models was defined as the normalized inverse of the Euclidian distance between the models.

Numerical Examples

Figures 1, 1A, 2:
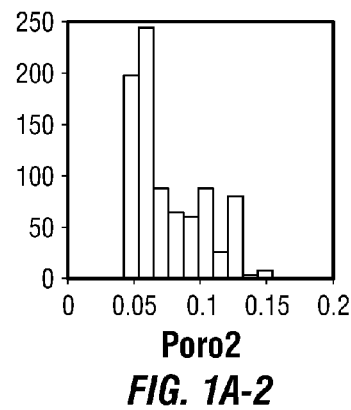

The minimax model selection approach is demonstrated on a real dataset from a gas condensate field, and the results are also compared to manual model selection and clustering. The dataset is the output of a history matching process, wherein, 841 history matched models were obtained by application of experimental design and genetic algorithms. The field has three reservoirs, and the input variables of interest for this exercise are the porosity multipliers, permeability multipliers and critical gas saturations of the three reservoirs (9 variables). FIG. 1 shows the histograms and cdfs of these input variables obtained from the 841 history matched models. The output variables of interest are the gas in places of reservoirs one and two and the full field, and the cumulative gas production of the field (4 variables). FIG. 2 shows the histograms and cdfs of these output variables obtained from the 841 history matched models. The objective of this exercise is to select 3 and 9 models, respectively, that are representative of these 841 models. For the 3 model case, the decision makers are interested in the P10, P50 and P90 models of the output variables, and for the 9 model case, the target percentiles are P10, P20, . . . , P90. For the 3 model selection problem, both the exhaustive enumeration approach and greedy algorithm were used to obtain the best models satisfying Equation (3); however, for the 9 model selection problem, the exhaustive approach is less applicable, thus only the greedy approach was used.

Figures 1, 1A, 2, 3:
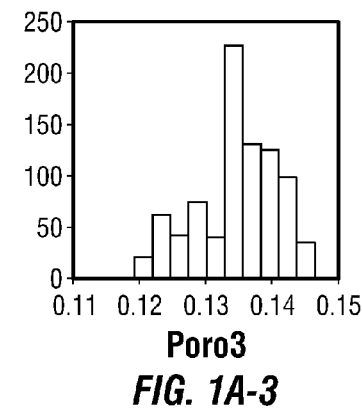
Figures 1, 1A, 2, 3, 4:
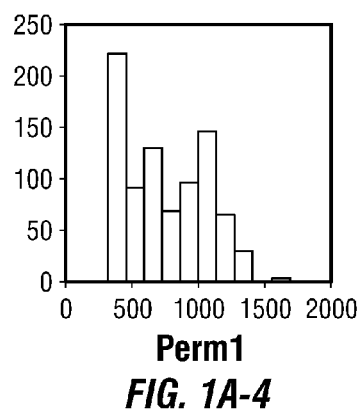
Figures 1, 1A, 2, 3, 4, 5:
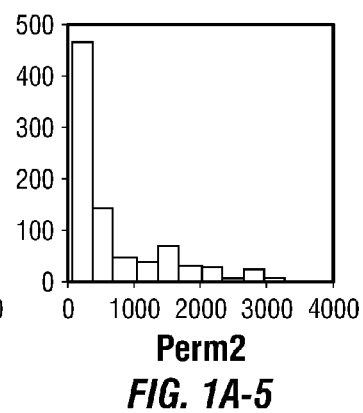
Figures 1, 1A, 2, 3, 4, 5, 6:
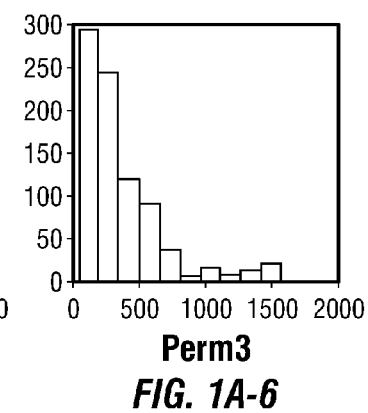
Figures 1, 1A, 2, 3, 4, 5, 6, 7:
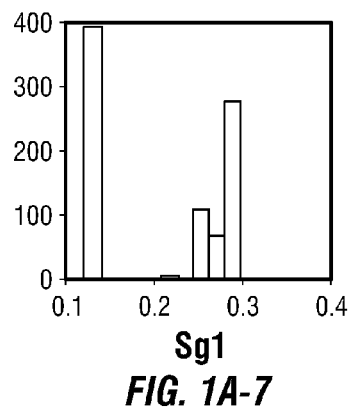

FIG. 3 shows the selection of 3 models manually, just based on the P10, P50 and P90 of the cdf of cumulative gas production. It is clear from FIG. 3 that these 3 models are hardly representative of the P10, P50 and P90 values of the rest of the 3 output variables. This also demonstrates the potential pitfalls of selecting models just based on one or two variables, as is common practice. FIG. 4 shows the models selected via minimax with exhaustive search, while FIG. 5 shows the same obtained with k-means clustering. Clearly, the models chosen via minimax are superior compared to both manual and clustering approaches in terms of matching target percentiles. FIG. 6 shows the models selected with minimax using the greedy algorithm. Although the selected models are not as good as minimax with exhaustive search, they are certainly acceptable. An interesting observation from FIG. 4 is that the P10 model of IGIP1 is the P90 model of IGIP2, the P90 of IGIP1 is the P50 of IGIP2, and P50 of IGIP1 is the P10 of IGIP2. This demonstrates that due to complex nonlinear relationships between variables, a given model may be close to different target percentiles for different variables. Clearly, from FIG. 7, there is somewhat of an inverse relationship between IGIP1 and IGIP2, resulting in this behavior. Physically, this may be due to the fact that the models are a result of history matching, thus, in order to match total gas in place, if IGIP1 is increased, IGIP2 (or IGIP3) has to be decreased to match observations. Thus, whenever a model is qualified in terms of percentiles (e.g., P50 model), it should be with respect to some variable (e.g. P50 with respect to oil in place), as just stating "P50 model" has little meaning.

Figures 1, 1A, 2, 3, 4, 5, 6, 7, 8:
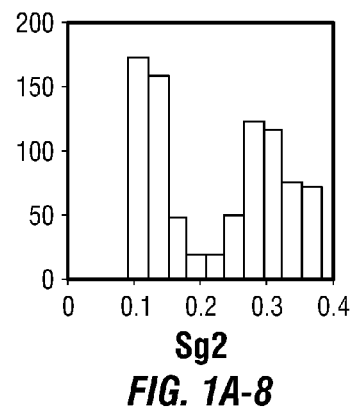
Figures 1, 1A, 2, 3, 4, 5, 6, 7, 8, 9:
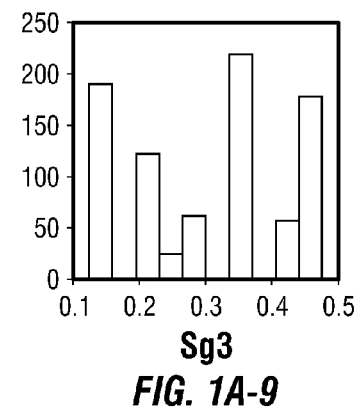
Figures 1, 1B:
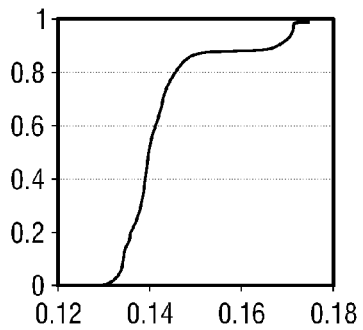
Figures 1, 1B, 2:
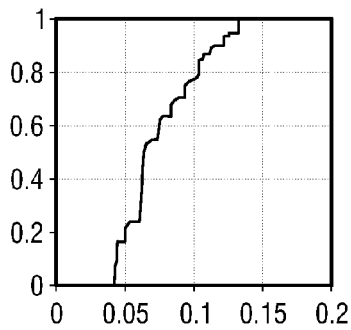
Figures 1, 1B, 2, 3:
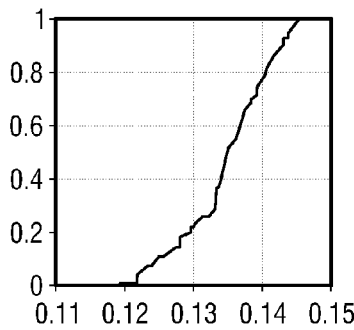
Figures 1, 1B, 2, 3, 4:
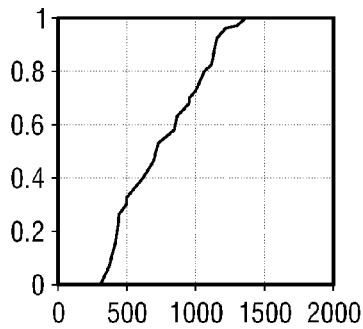
Figures 1, 1B, 2, 3, 4, 5:
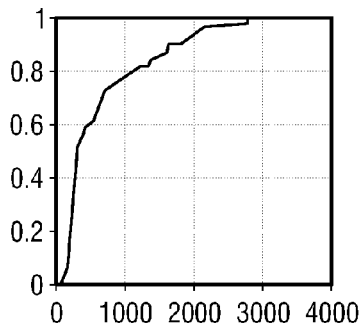
Figures 1, 1B, 2, 3, 4, 5, 6:
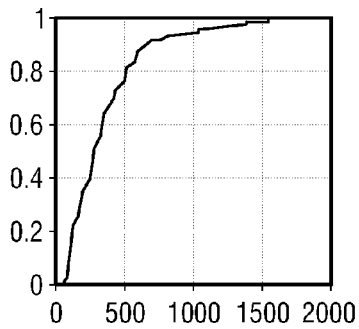
Figures 1, 1B, 2, 3, 4, 5, 6, 7:
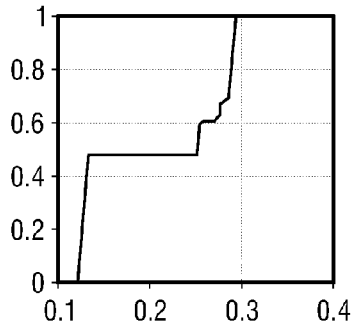
Figures 1, 1B, 2, 3, 4, 5, 6, 7, 8:
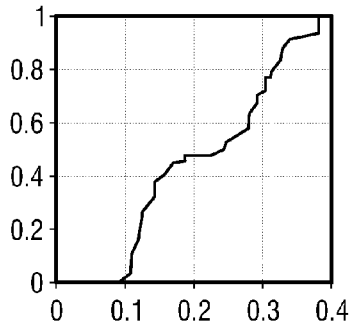
Figures 1, 1B, 2, 3, 4, 5, 6, 7, 8, 9:
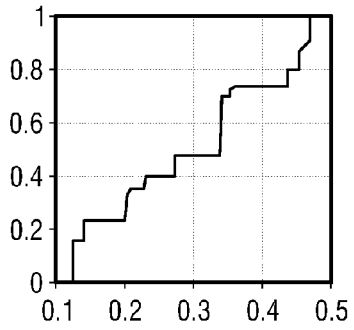
Figures 1, 2B:
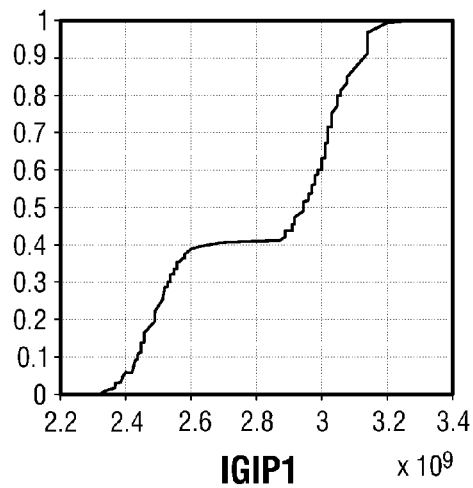
Figures 2, 2B:
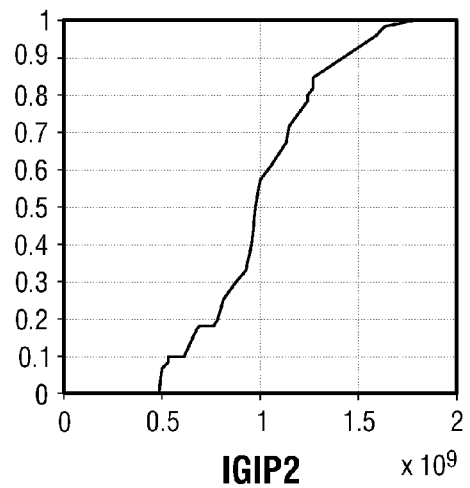
Figures 2, 2B, 3:
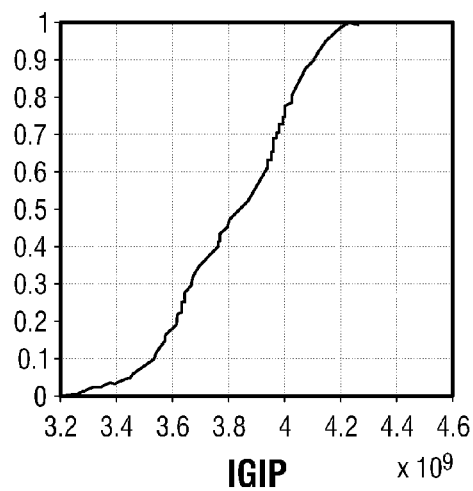
Figures 2, 2B, 3, 4:
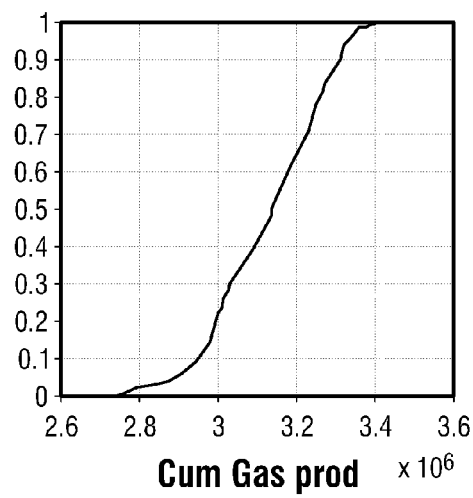
Figures 1, 3A:
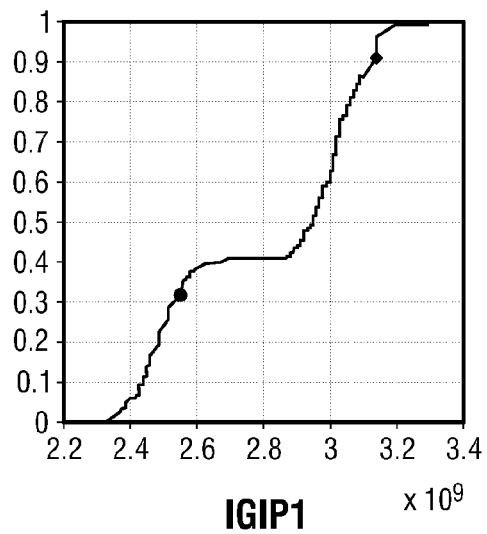
Figures 2, 3A:
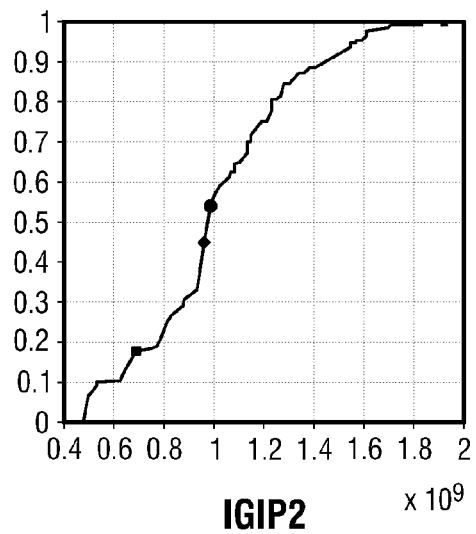
Figures 3, 3A:
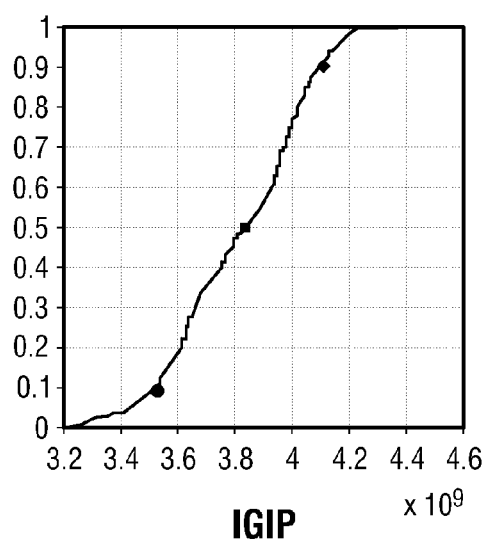
Figures 3, 3A, 4:
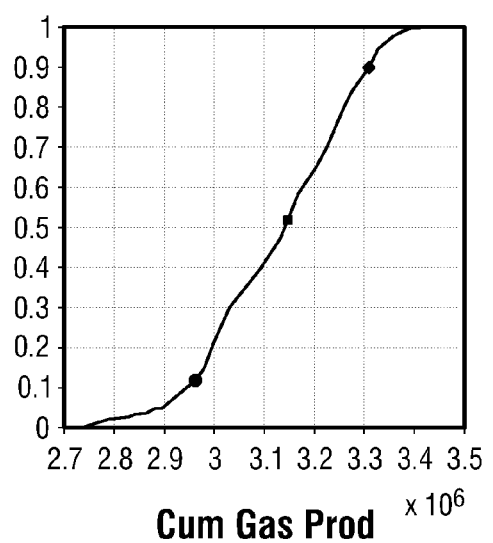
Figures 1, 4A:
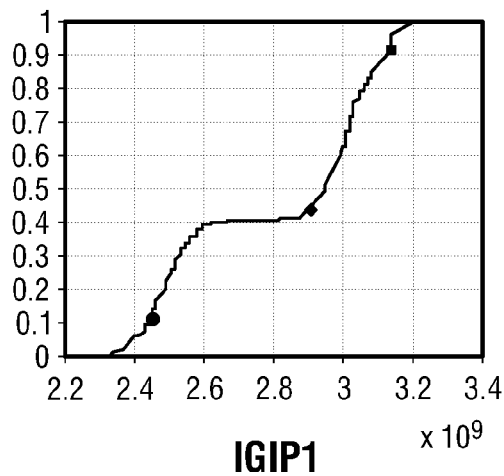
Figures 2, 4A:
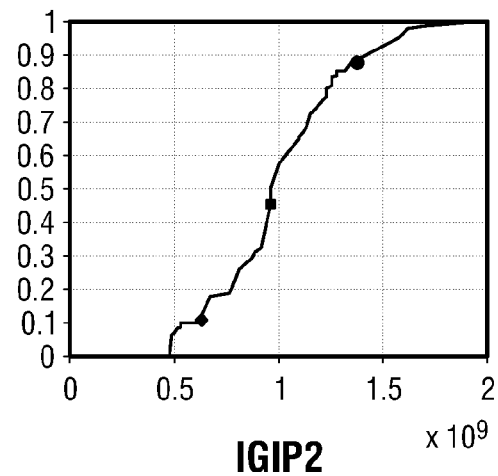
Figures 3, 4A:
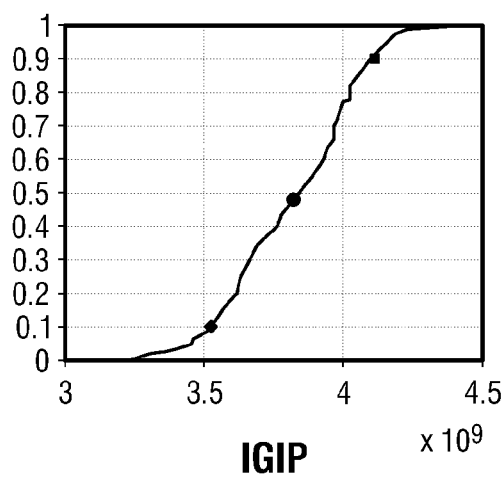
Figures 4, 4A:
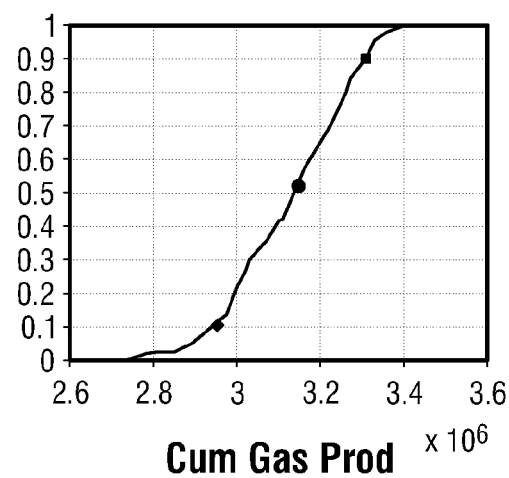
Figures 1, 5A:
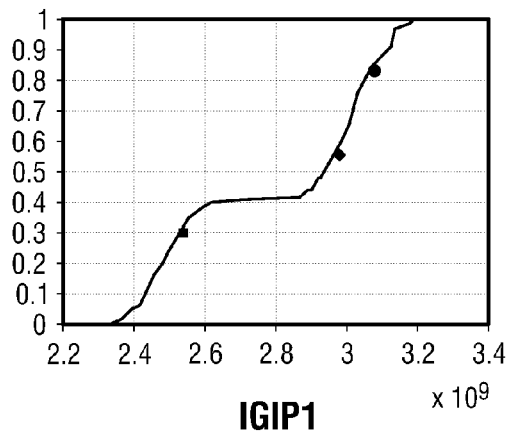
Figures 2, 5A:
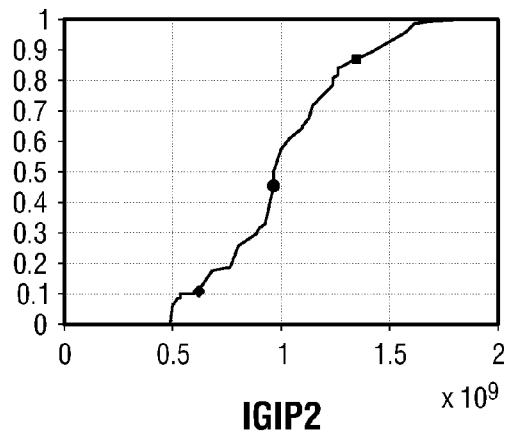
Figures 3, 5A:
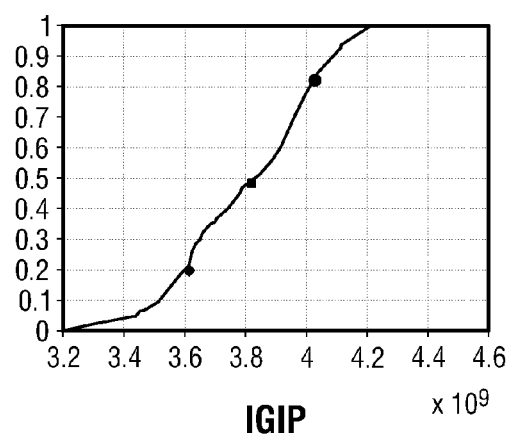
Figures 4, 5A:
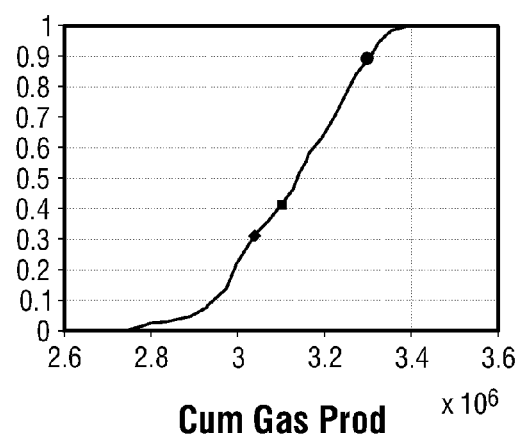
Figures 1, 6A:
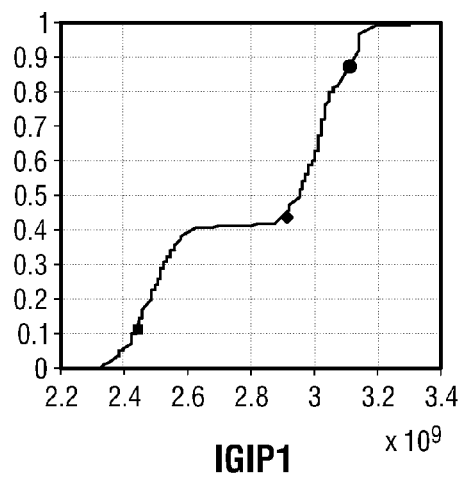
Figures 2, 6A:
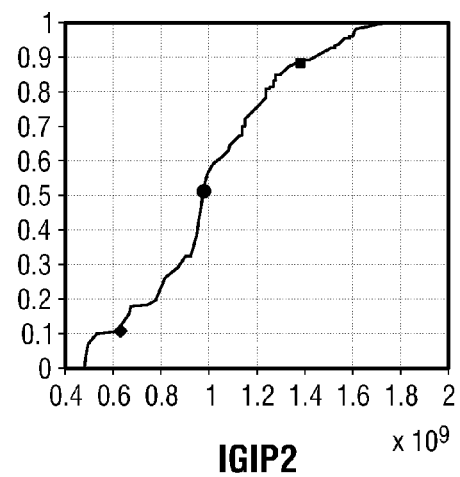
Figures 3, 6A:
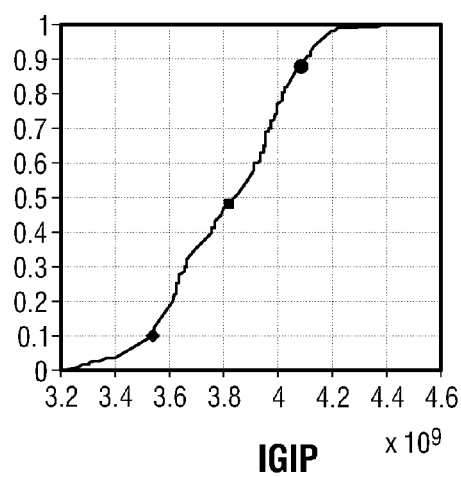
Figures 4, 6A:
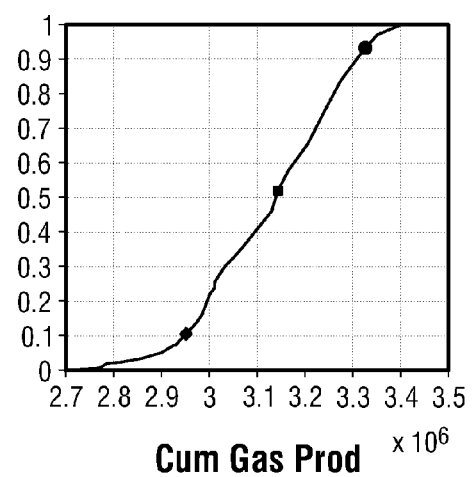
Figure 7:
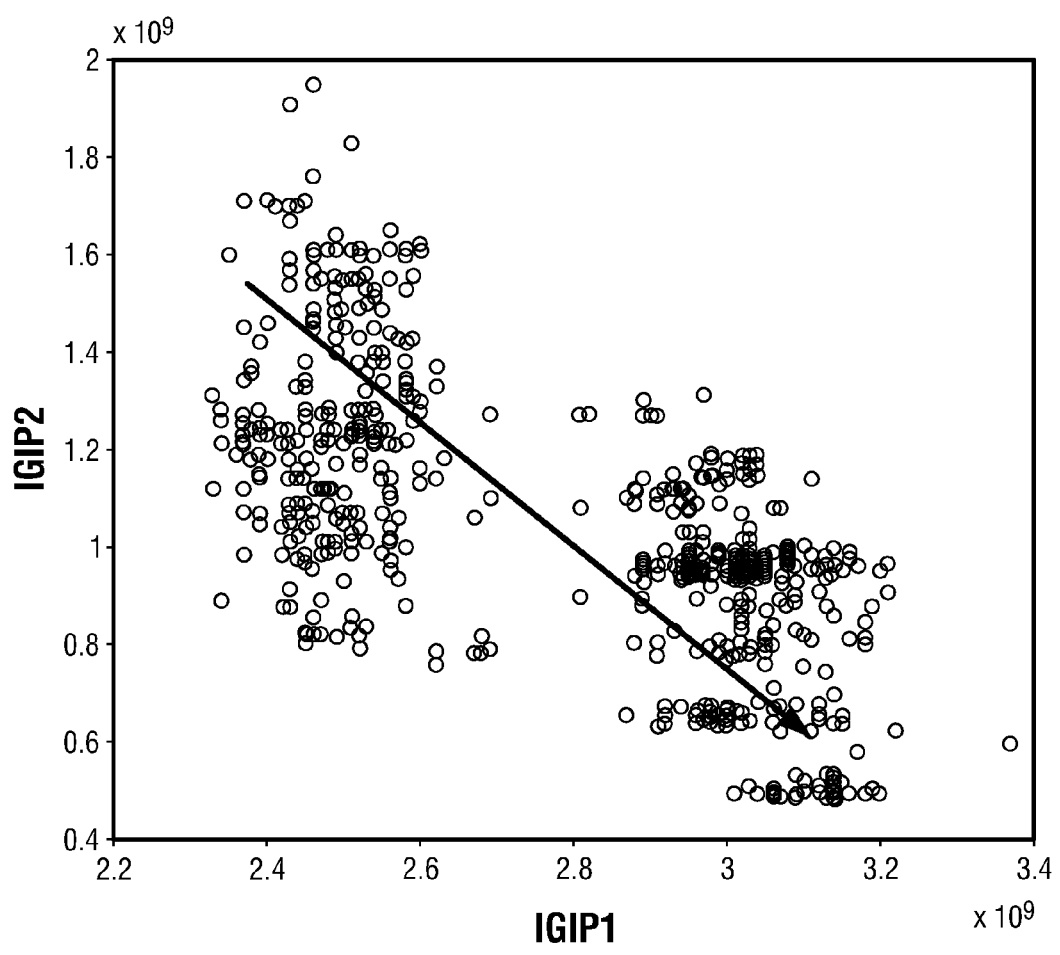
Figures 1, 8A:
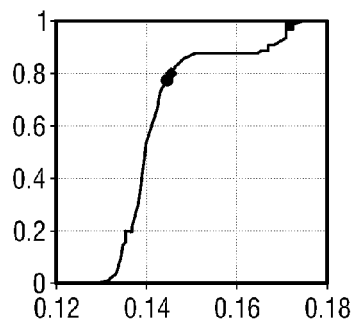
Figures 2, 8A:
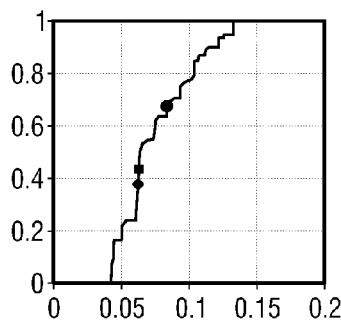
Figures 3, 8A:
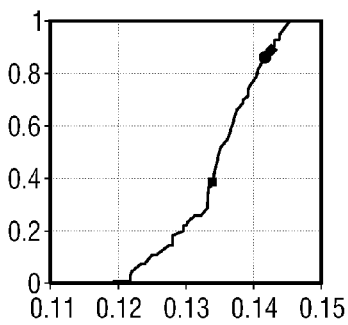
Figures 4, 8A:
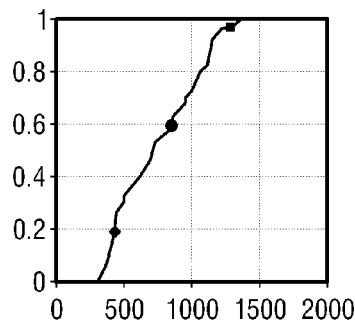
Figures 5, 8A:
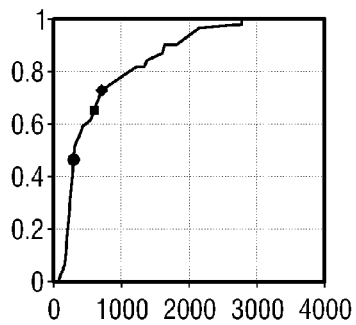
Figures 6, 8A:
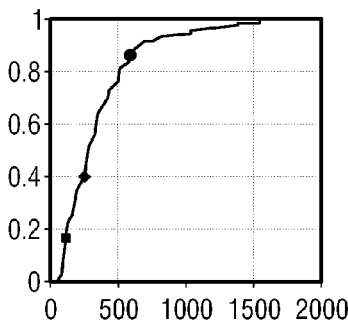
Figures 7, 8A:
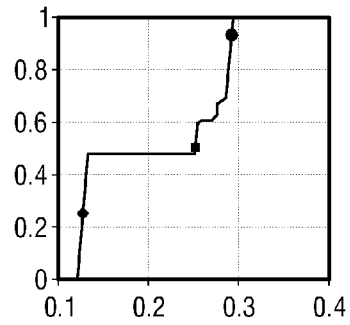
Figures 8, 8A:
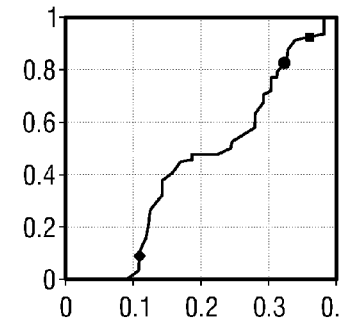
Figures 8, 8A, 9:
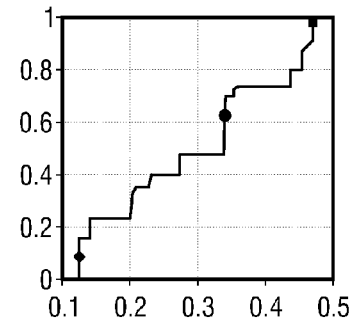
Figures 1, 9A:
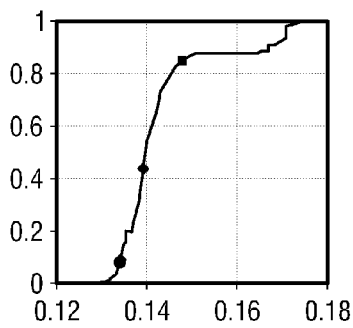
Figures 2, 9A:
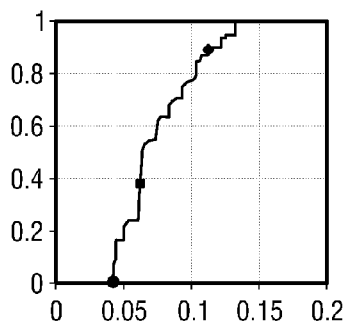
Figures 3, 9A:
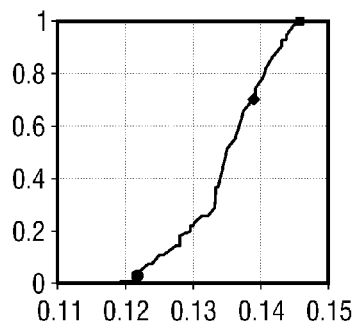
Figures 4, 9A:
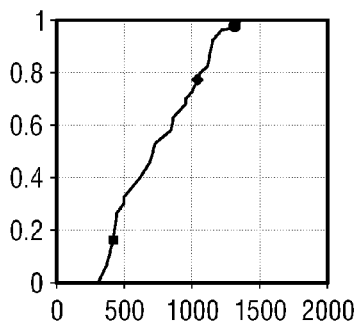
Figures 5, 9A:
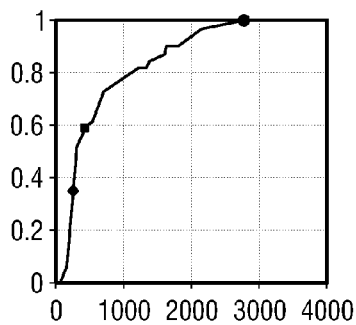
Figures 6, 9A:
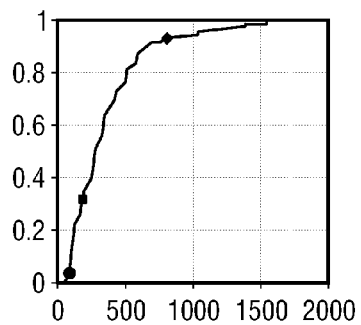
Figures 7, 9A:
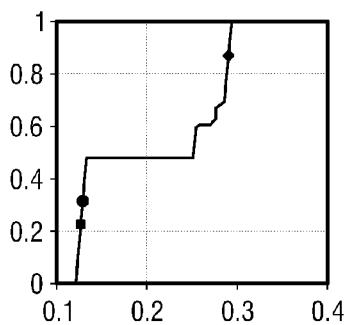
Figures 8, 9A:
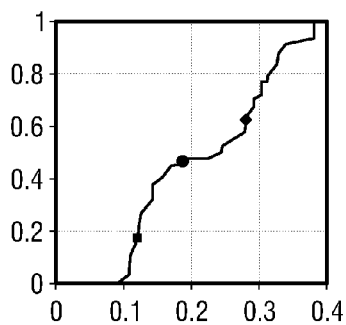
Figures 9, 9A:
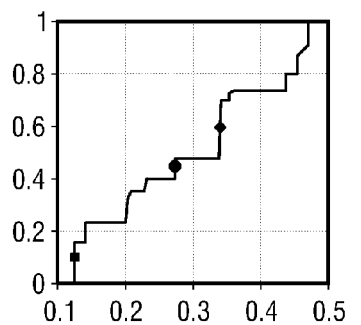
Figures 1, 10A:
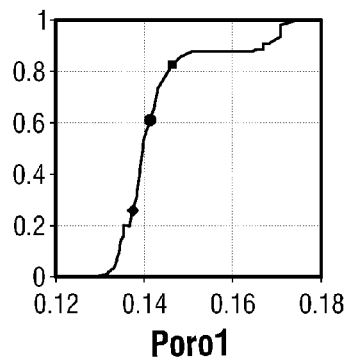
Figures 2, 10A:
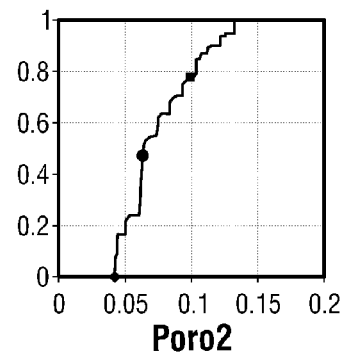
Figures 3, 10A:
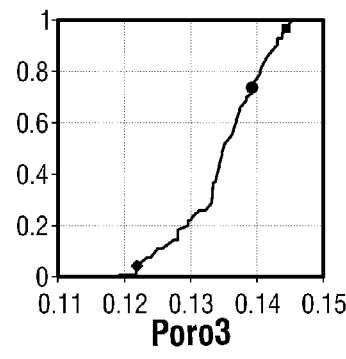
Figures 4, 10A:
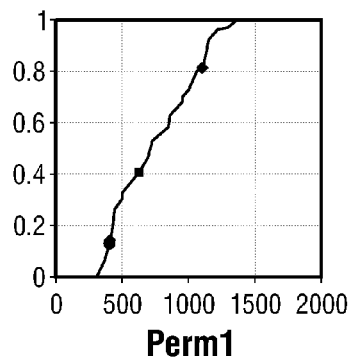
Figures 5, 10A:
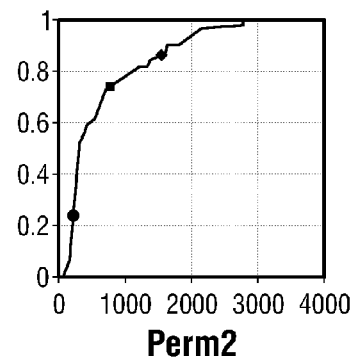
Figures 6, 10A:
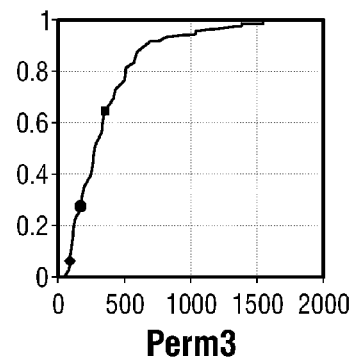
Figures 7, 10A:
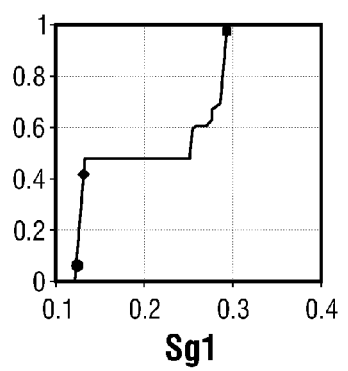
Figures 8, 10A:
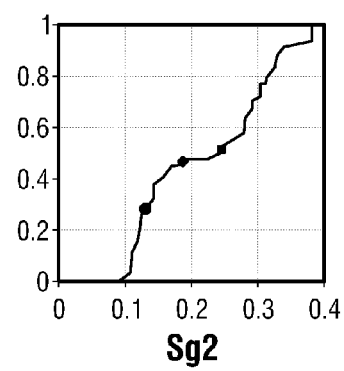
Figures 9, 10A:
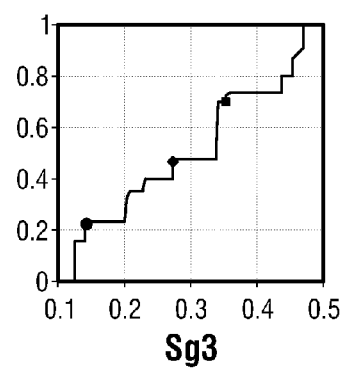
Figures 1, 11A:
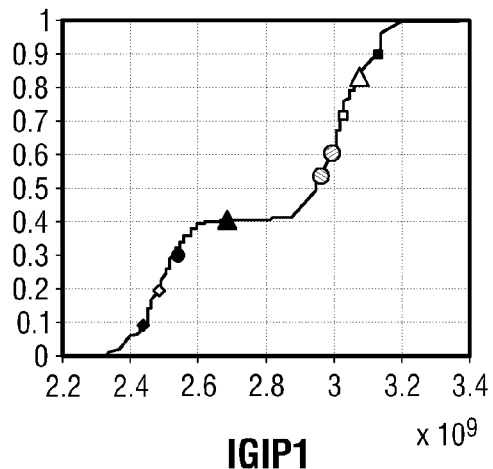
Figures 2, 11A:
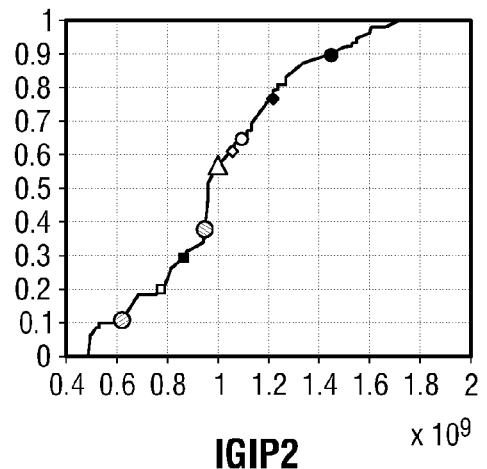
Figures 3, 11A:
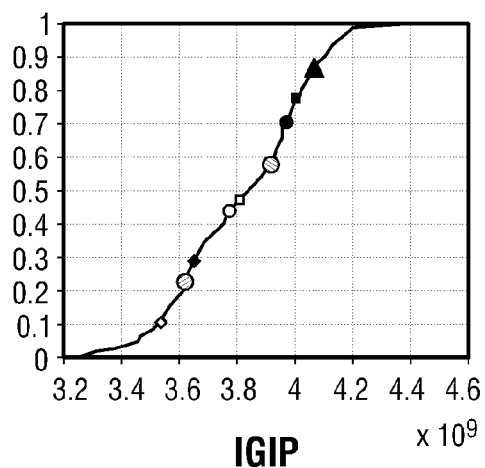
Figures 4, 11A:
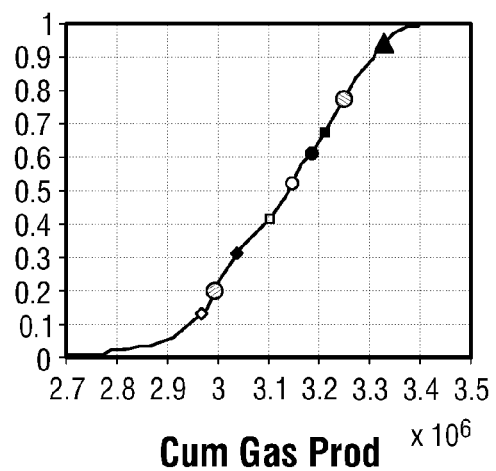
Figures 1, 12A:
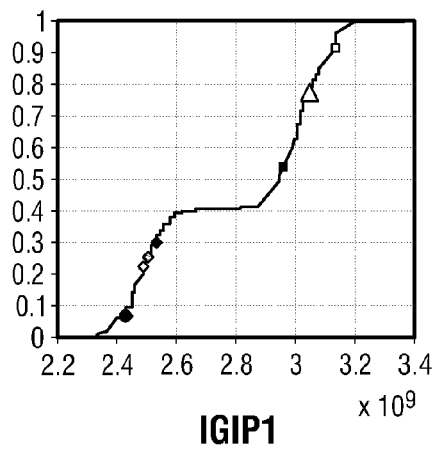
Figures 2, 12A:
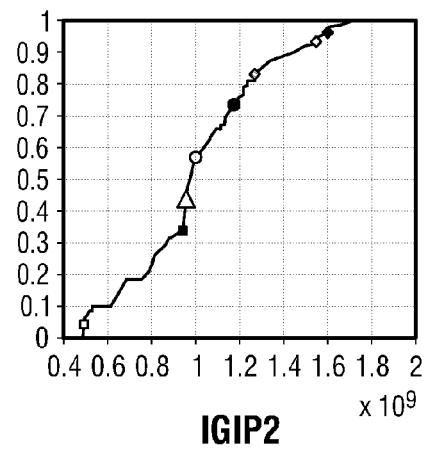
Figures 3, 12A:
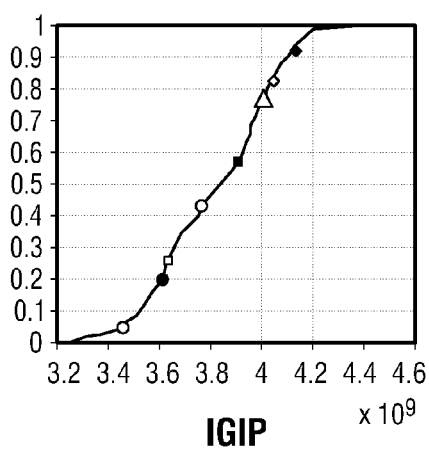
Figures 4, 12A:
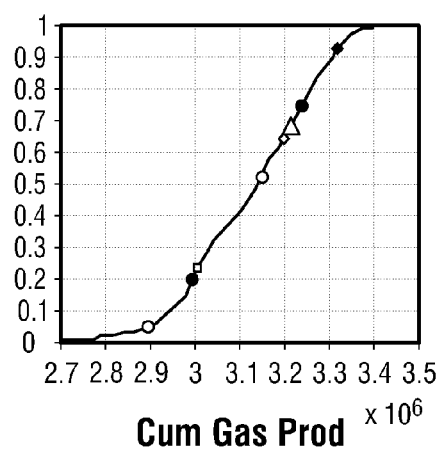
Figures 1, 13A:
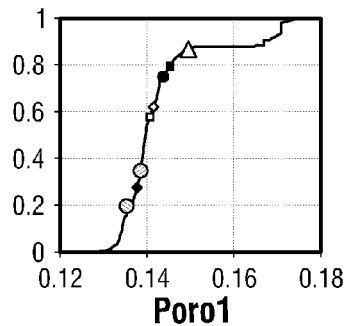
Figures 2, 13A:
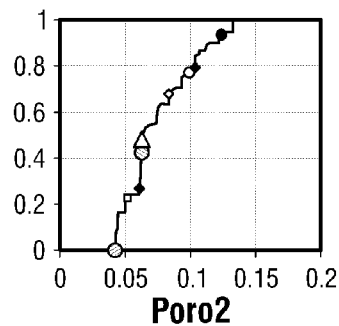
Figures 3, 13A:
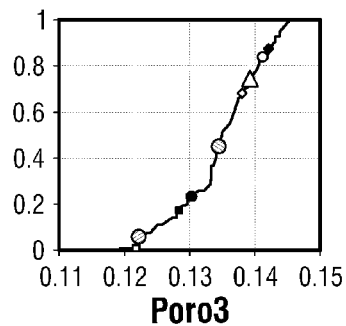
Figures 4, 13A:
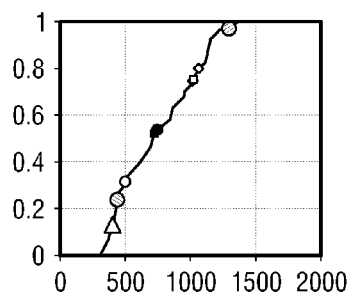
Figures 5, 13A:
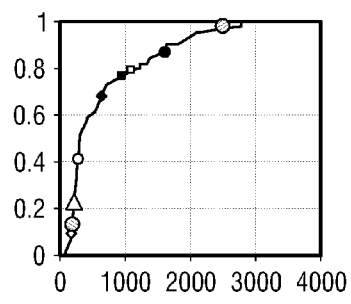
Figures 6, 13A:
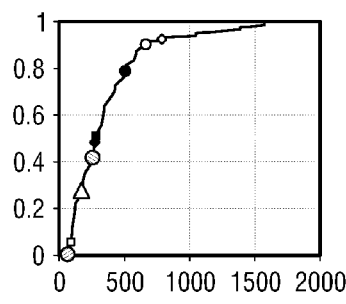
Figures 7, 13A:
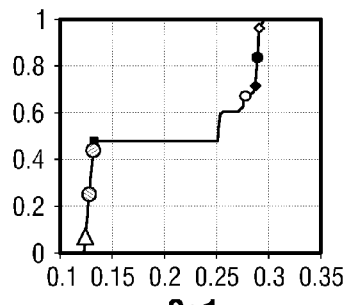
Figures 8, 13A:
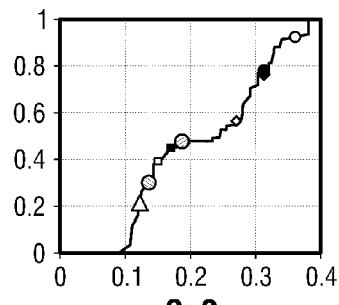
Figures 9, 13A:
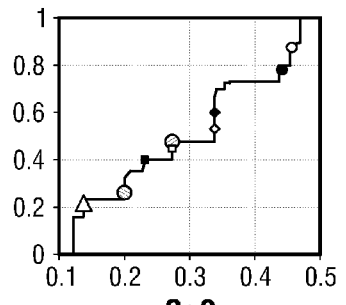
Figures 1, 14A:
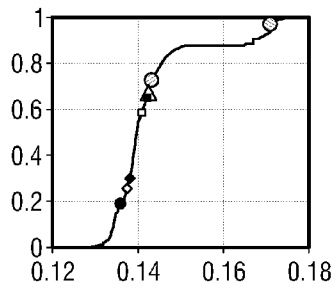
Figures 2, 14A:
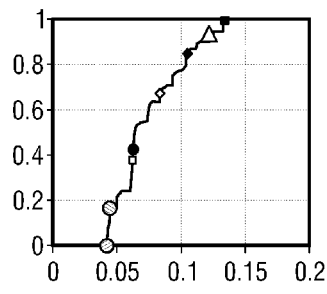
Figures 3, 14A:
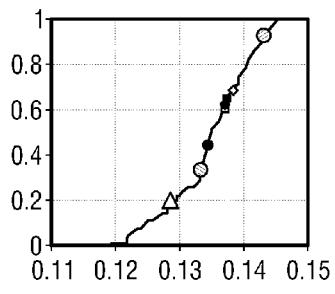
Figures 4, 14A:
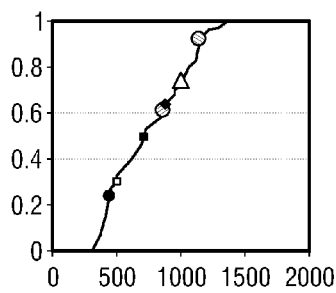
Figures 5, 14A:
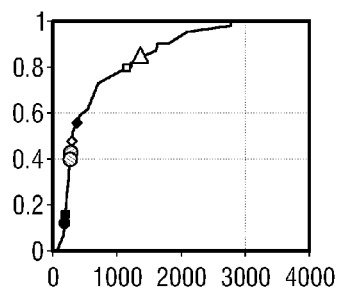
Figures 6, 14A:
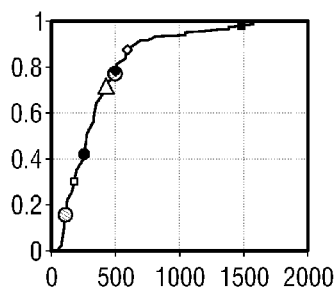
Figures 7, 14A:
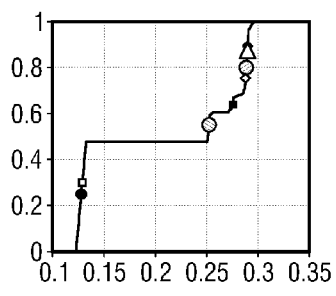
Figures 8, 14A:
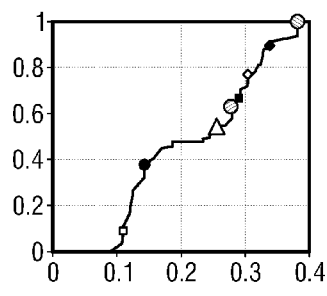
Figures 9, 14A:
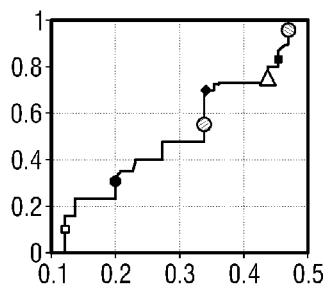

FIGS. 8, 9, and 10 show how the selected models are spread in the input uncertainty space. Both minimax and clustering perform similarly as both algorithms are essentially trying to find models different from each other. However, the model spread from these approaches seems to be somewhat better compared to the manual approach.

FIGS. 11 and 12 show the selected models using minimax and distance-based clustering for the 9 model selection problem on the cdfs of the 4 output variables. Again, as in the 3 model case, the models selected by minimax are much closer to the target percentiles overall compared to the distance-based clustering approach, and are more evenly spread. Further, as seen in FIGS. 13 and 14, the selected models are also better spread out in the input uncertainty space with minimax compared to distance-based clustering. Note that the results shown here use enumeration for the optimization problem in Equation (5), although the results with SA are comparable.

Figures 15, 16:
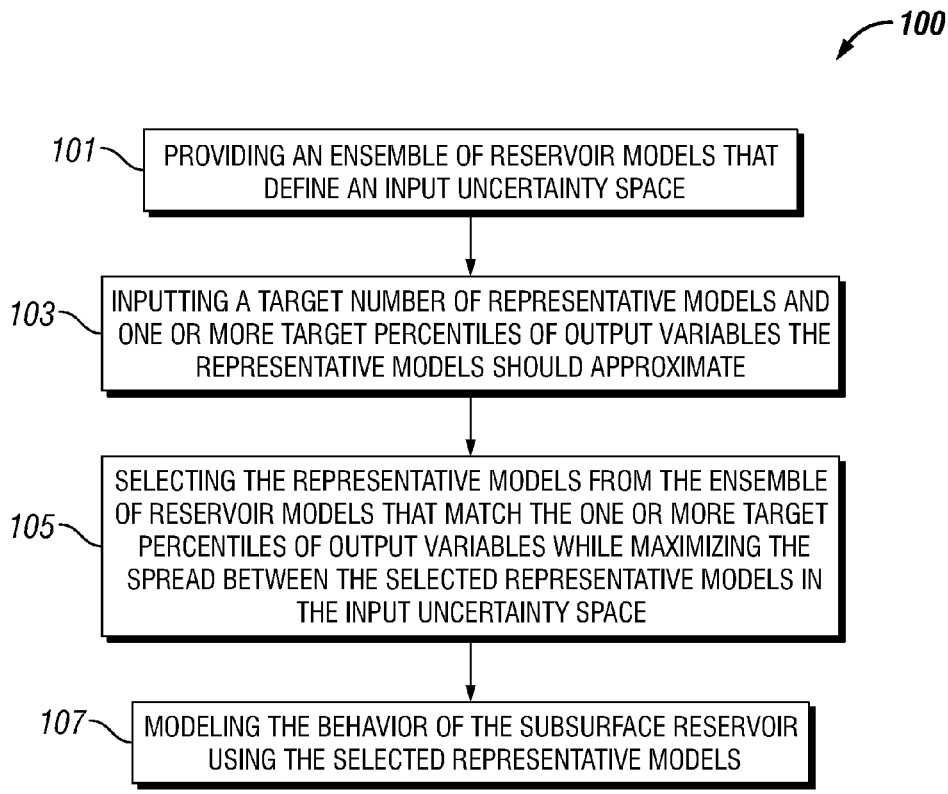
FIG. 15 illustrates computational time for minimax and k-means clustering for the 3 and 9 model selection problems.
FIG. 16 illustrates a method for model selection.

FIG. 15 compares the computing time required by minimax vs. k-means clustering as implemented in Chevron's proprietary software genOpt. In this particular implementation of clustering, minimax is orders of magnitude faster.

Accordingly, the minimax model selection is able to efficiently select a few representative models from a large set of models. The minimax model selection approach is needed because many uncertainty quantification, history matching and optimization workflows result in a large number of models, and the analysis of such a large number of models in the decision making and planning process is generally intractable. As such, decision-makers may still require a subset of representative models (e.g., P10, P50, P90 models) for the decision making and planning process. "Representative" here is defined as "statistically" representative, wherein models are sought that match the target percentiles of the output variables of interest. At the same time, the selected models should be maximally "different" from each other in the input uncertainty space. The minimax model selection approach is demonstrated on a real dataset of a gas condensate field, and compared to manual and clustering based approaches. The results indicate that minimax provides a superior model selection both in terms of matching target percentiles of the output variables and maximizing spread in the input uncertainty space. Further, minimax is orders of magnitude faster compared to k-means clustering as implemented in genOpt.

The above described methods can be implemented in the general context of instructions executed by a computer. Such computer-executable instructions may include programs, routines, objects, components, data structures, and computer software technologies that can be used to perform particular tasks and process abstract data types. Software implementations of the above described methods may be coded in different languages for application in a variety of computing platforms and environments. It will be appreciated that the scope and underlying principles of the above described methods are not limited to any particular computer software technology.

Moreover, those skilled in the art will appreciate that the above described methods may be practiced using any one or a combination of computer processing system configurations, including, but not limited to, single and multi-processor systems, hand-held devices, programmable consumer electronics, mini-computers, or mainframe computers. The above described methods may also be practiced in distributed or parallel computing environments where tasks are performed by servers or other processing devices that are linked through one or more data communications networks. For example, the large computational problems arising in reservoir simulation can be broken down into smaller ones such that they can be solved concurrently—or in parallel. In particular, the system can include a cluster of several stand-alone computers. Each stand-alone computer can comprise a single core or multiple core microprocessors that are networked through a hub and switch to a controller computer and network server. An optimal number of individual processors can then be selected for a given problem.

FIG. 16 illustrates a flow diagram showing computer-implemented method 100 for selecting representative models from a large ensemble of models. In step 101, an ensemble of reservoir models that define an input uncertainty space is provided. In step 103, a target number of representative models and one or more target percentiles of output variables that the representative models are to approximate are input or selected. In step 105, the representative models from the ensemble of reservoir models that match the one or more target percentiles of output variables are selected while maximizing the spread between the selected representative models in the input uncertainty space. In optional step 107, the selected representative models are utilized for modeling (e.g., analyzing, forecasting, simulating) the behavior of a subsurface reservoir. For example, the selected representative models can be used to forecast target percentiles (e.g., P10, P50, P90) of cumulative fluid injection amounts, fluid injection rates, cumulative fluid production amounts, fluid production rates, bottom hole pressure (BHP) profiles for injectors and producers, and the net present value (NPV) of an optimized case.

Figure 17:
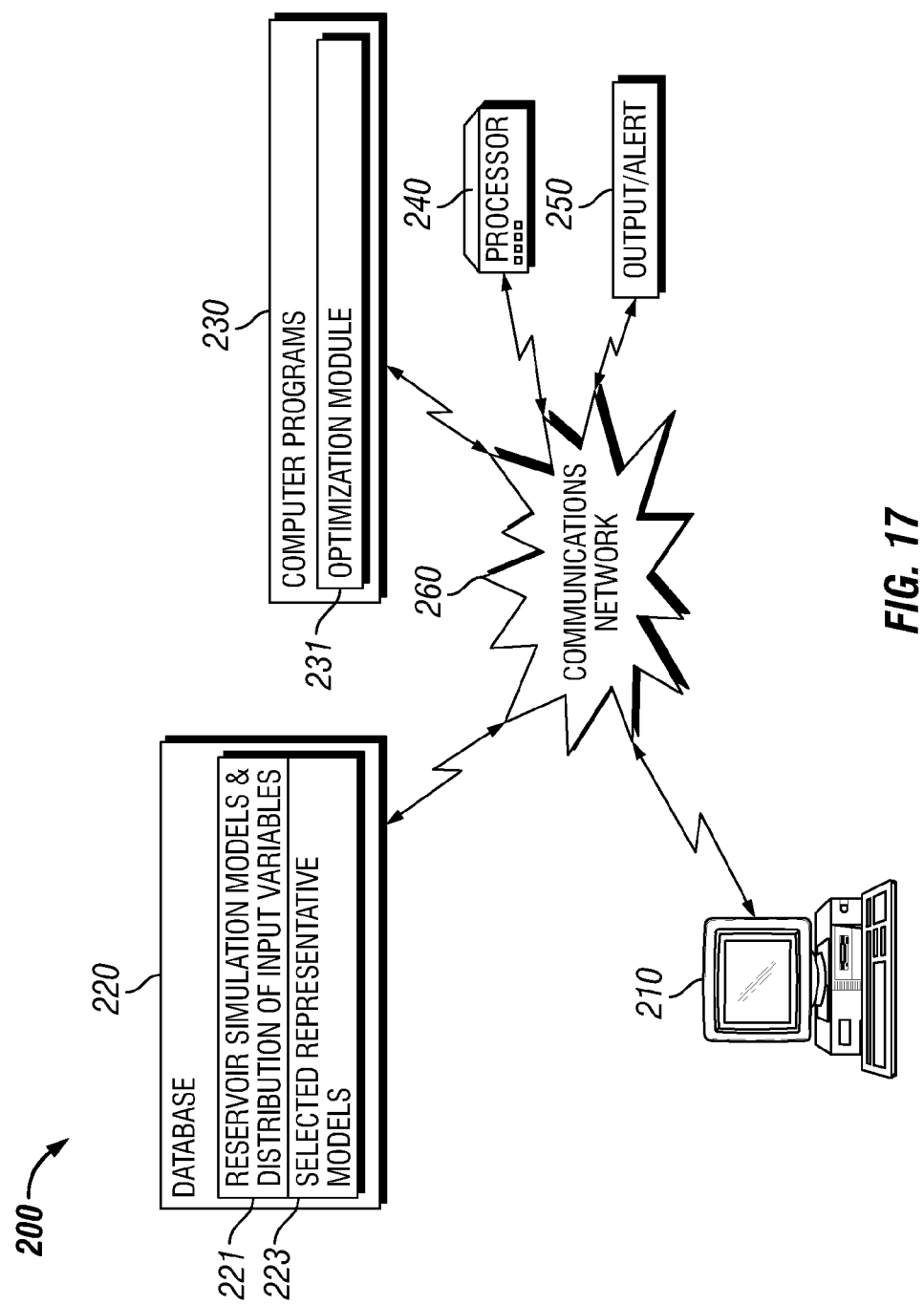
FIG. 17 illustrates a system for model selection.

FIG. 17 illustrates a system 200 for model selection, such as by implementing computer-implemented method 100. System 200 includes user interface 210, such that an operator can actively input information and review operations of system 200. User interface 210 can be any means in which a person is capable of interacting with system 200 such as a keyboard, mouse, or touch-screen display. Operator-entered data input into system 200 through user interface 210 can be stored in database 220. Additionally, any information generated by system 200 can be stored in database 220. Reservoir Simulation Models and Distribution of Input Variables 221 and Selected Representative Models 223 are examples of information that can be stored in database 220.

System 200 includes software instructions or computer program 230 that is stored on a non-transitory computer usable or processor readable medium. Current examples of such non-transitory medium include, but are not limited to, read-only memory (ROM) devices, random access memory (RAM) devices, and semiconductor-based memory devices. This includes flash memory devices, programmable ROM (PROM) devices, erasable programmable ROM (EPROM) devices, electrically erasable programmable ROM (EEPROM) devices, dynamic RAM (DRAM) devices, static RAM (SRAM) devices, magnetic storage devices (e.g., floppy disks, hard disks), optical disks (e.g., compact disks (CD-ROMs)), and integrated circuits. Non-transitory medium can be transportable such that the one or more computer programs (i.e., a plurality of software instructions) stored thereon can be loaded onto a computer resource such that when executed on the one or more computers or processors, performs the aforementioned functions of the various embodiments of the present invention.

System 200 includes one or more modules and/or is in communication with one or more devices (e.g., a linear solver) configured to perform any step of any of the methods (e.g., method 100) described herein. Processor 240 interprets instructions to execute software 230 and generates automatic instructions to execute software for system 200 responsive to predetermined conditions. Instructions from both user interface 210 and software 230 are processed by processor 240 for operation of system 200. In some embodiments, a plurality of processors can be utilized such that system operations can be executed more rapidly.

An example of a module for software 230 includes, but is not limited to, optimization module 231. Optimization module 231 can have computer-readable software instructions to obtain information from database 220. For example, optimization module 231 can retrieve stored reservoir models and distributions of input variables. Optimization module 231 includes computer-readable software instructions to input a target number of representative models and one or more target percentiles of output variables that the representative models are to approximate. Optimization module 231 includes computer-readable software instructions to select the representative models from the ensemble of reservoir models that match the one or more target percentiles of output variables while maximizing the spread between the selected representative models in the input uncertainty space. Optimization module 231 can also include computer-readable software instructions to output the selected representative models such that they can be used for modeling (e.g., analyzing, forecasting, simulating) the behavior of a subsurface reservoir. For example, the selected representative models can be output to forecast target percentiles (e.g., P10, P50, P90) of cumulative fluid injection amounts, fluid injection rates, cumulative fluid production amounts, fluid production rates, bottom hole pressure (BHP) profiles for injectors and producers, and the net present value (NPV) of an optimized case.

In certain embodiments, system 200 can include reporting unit 250 to provide information, such as a display of selected representative models, or output variables & uncertainty, to the operator or to other systems (not shown). For example, reporting unit 250 can be a printer, display screen, or a data storage device. However, it should be understood that system 200 need not include reporting unit 250, and alternatively user interface 210 can be utilized for reporting information of system 200 to the operator.

Communication between any components of system 200, such as user interface 210, database 220, software 230, processor 240 and reporting unit 250, can be transferred over a communications network 260. Computer system 200 can be linked or connected to other, remote computer systems (e.g., a forward simulation module) via communications network 260. Communications network 260 can be any means that allows for information transfer to facilitate sharing of knowledge and resources, and can utilize any communications protocol such as the Transmission Control Protocol/Internet Protocol (TCP/IP). Examples of communications network 260 include, but are not limited to, personal area networks (PANs), local area networks (LANs), wide area networks (WANs), campus area networks (CANs), and virtual private networks (VPNs). Communications network 260 can also include any hardware technology or equipment used to connect individual devices in the network, such as by wired technologies (e.g., twisted pair cables, co-axial cables, optical cables) or wireless technologies (e.g., radio waves).

In operation, an operator initiates software 230, through user interface 210, to perform the methods described herein. Outputs from each software module can be stored in database 220. A visual display can be produced, such as through reporting unit 250 or user interface 210, using the outputs of software 230. For example, the selected representative models can be transformed into image data representations for display to a user or operator. Alternatively, outputs from software 230 can be sent via communications network 260 to other systems (not shown). The output information can be utilized to forecast or optimize the production performance of the subterranean reservoir, which can then be used for reservoir management decisions. For example, output from system 200 can be used to determine cumulative fluid injection amounts, fluid injection rates, cumulative fluid production amounts, fluid production rates, bottom hole pressure (BHP) profiles for injectors and producers, and the net present value (NPV) of an optimized case.

As used in this specification and the following claims, the terms "comprise" (as well as forms, derivatives, or variations thereof, such as "comprising" and "comprises") and "include" (as well as forms, derivatives, or variations thereof, such as "including" and "includes") are inclusive (i.e., open-ended) and do not exclude additional elements or steps. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent of the given numeric value provided such a deviation does not alter the end function or result of the value. Therefore, a value of about 1% can be construed to be a range from 0.9% to 1.1%.

While in the foregoing specification this invention has been described in relation to certain preferred embodiments thereof, and many details have been set forth for the purpose of illustration, it will be apparent to those skilled in the art that the invention is susceptible to alteration and that certain other details described herein can vary considerably without departing from the basic principles of the invention. For example, while embodiments of the present disclosure are described with reference to block diagrams and/or operational illustrations of methods, systems, and computer program products, the functions/acts described in the figures may occur out of the order (i.e., two blocks shown in succession may in fact be executed substantially concurrently or the blocks may sometimes be executed in the reverse order).

What is claimed is:

1. A computer-implemented method for model selection, the computer-implemented method comprising:
   (a) providing an ensemble of reservoir models for a reservoir that define an input uncertainty space;
   (b) inputting a target number of representative models and one or more target percentiles of output variables that the representative models are to approximate;
   (c) selecting the representative models from the ensemble of reservoir models that match the one or more target percentiles of output variables while maximizing the spread between the selected representative models in the input uncertainty space, wherein selecting the representative models from the ensemble of reservoir models comprises solving a single constrained minimax optimization problem, and wherein the single constrained minimax optimization problem is represented mathematically as:

$$\text{for } i = 1 : \text{nTrials}$$
$$\quad \text{for } j = 1 : P$$
$$\quad\quad X^j = \arg \underset{X^j \in C}{\text{rand}} \left\{ \left( \max_k \min_l \left| \frac{y_k^j - y_k^l}{y_k^l} \right| \right) < \varepsilon \right\} \quad \begin{array}{l} \forall\, k = 1, \ldots, \\ M: l = 1, \ldots, \\ P - j + 1 \end{array}$$
$$\quad\quad \text{sub to:} \quad\quad\quad\quad\quad\quad\quad\quad\quad\quad \forall\, q = j - 1, \ldots, 1$$
$$\quad\quad \text{nnz}(\text{prctile}(Y^j) == \text{prctile}(Y^q)) = 0$$
$$\quad \text{end}$$
$$\text{end};$$

and
   (d) modeling a behavior of the reservoir using the selected representative models.

2. The computer-implemented method of claim 1, wherein the single constrained minimax optimization problem is solved directly by enumeration.

3. The computer-implemented method of claim 1, wherein the single constrained minimax optimization problem is solved by Markov chain Monte Carlo methods.

4. The computer-implemented method of claim 1, wherein the single constrained minimax optimization problem is solved using a greedy method with randomization.

5. The computer-implemented method of claim 1, wherein the single constrained minimax optimization problem is solved using a global exhaustive search.

6. The computer-implemented method of claim 1, further comprising selecting the representative models from the ensemble of reservoir models by solving two minimax optimization problems sequentially.

7. A system for model selection, the system comprising:
   a database configured to store an ensemble of reservoir models for a reservoir that define an input uncertainty space;
   a computer processor configured to receive the ensemble of reservoir models that define the input uncertainty space from the database, and to execute computer readable software instructions; and
   a software program executable on the computer processor, the software program containing computer-readable software instructions to:
   input a target number of representative models and one or more target percentiles of output variables that the representative models are to approximate; and
   select the representative models from the ensemble of reservoir models that match the one or more target percentiles of output variables while maximizing the spread between the selected representative models in the input uncertainty space, wherein selecting the representative models from the ensemble of reservoir models comprises solving a single constrained minimax optimization problem, and wherein the single constrained minimax optimization problem is represented mathematically as:

$$\text{for } i = 1 : \text{nTrials}$$
$$\quad \text{for } j = 1 : P$$
$$\quad\quad X^j = \arg \underset{X^j \in C}{\text{rand}} \left\{ \left( \max_k \min_l \left| \frac{y_k^j - y_k^l}{y_k^l} \right| \right) < \varepsilon \right\} \quad \begin{array}{l} \forall\, k = 1, \ldots, \\ M: l = 1, \ldots, \\ P - j + 1 \end{array}$$
$$\quad\quad \text{sub to:} \quad\quad\quad\quad\quad\quad\quad\quad\quad\quad \forall\, q = j - 1, \ldots, 1$$
$$\quad\quad \text{nnz}(\text{prctile}(Y^j) == \text{prctile}(Y^q)) = 0$$
$$\quad \text{end}$$
$$\text{end};$$

and
   (d) model a behavior of the reservoir using the selected representative models.

8. The system of claim 7, wherein the single constrained minimax optimization problem is solved directly by enumeration.

9. The system of claim 7, wherein the single constrained minimax optimization problem is solved by Markov chain Monte Carlo methods.

10. The system of claim 7, wherein the single constrained minimax optimization problem is solved using a greedy method with randomization.

11. The system of claim 7, wherein the single constrained minimax optimization problem is solved using a global exhaustive search.

12. The system of claim 7, wherein the software program further comprises computer-readable software instructions, that upon execution on the processor, select the representative models from the ensemble of reservoir models by solving two minimax optimization problems sequentially.

13. A non-transitory processor readable medium containing computer-readable software instructions for model selection, the computer-readable software instructions having instructions to:
  obtain information from a database storing an ensemble of reservoir models for a reservoir that define an input uncertainty space;
  input a target number of representative models and one or more target percentiles of output variables that the representative models are to approximate; and
  select the representative models from the ensemble of reservoir models that match the one or more target percentiles of output variables while maximizing the spread between the selected representative models in the input uncertainty space, wherein selecting the representative models from the ensemble of reservoir models comprises solving a single constrained minimax optimization problem, and wherein the single constrained minimax optimization problem is represented mathematically as:

--- for i = 1: nTrials
  for j = 1: P $$X^j = \arg\operatorname*{rand}_{X^j \in C}\left\{\left(\max_k \min_l \left|\frac{y_k^j - \bar{y}_k^l}{\bar{y}_k^l}\right|\right) < \varepsilon\right\} \quad \begin{array}{l} \forall\, k = 1, \ldots, \\ M : l = 1, \ldots, \\ P - j + 1 \end{array}$$

sub to:                                $\forall\, q = j - 1, \ldots, 1$ $$\operatorname{nnz}(\operatorname{prctile}(Y^j) == \operatorname{prctile}(Y^q)) = 0$$
  end
end;

--- and
  (d) model a behavior of the reservoir using the selected representative models.

14. The non-transitory processor readable medium of claim 13, wherein the single constrained minimax optimization problem is solved directly by enumeration.

15. The non-transitory processor readable medium of claim 13, wherein the single constrained minimax optimization problem is solved by Markov chain Monte Carlo methods.

16. The non-transitory processor readable medium of claim 13, wherein the single constrained minimax optimization problem is solved using a greedy method with randomization.

17. The non-transitory processor readable medium of claim 13, wherein the single constrained minimax optimization problem is solved using a global exhaustive search.

18. The non-transitory processor readable medium of claim 13, wherein the computer-readable software instructions further comprises instructions to select the representative models from the ensemble of reservoir models by solving two minimax optimization problems sequentially.

* * * * *